United States Patent [19]
Burns et al.

[11] Patent Number: 6,147,397
[45] Date of Patent: Nov. 14, 2000

[54] STRESS ISOLATED INTEGRATED CIRCUIT AND METHOD FOR MAKING

[75] Inventors: David W. Burns, San Jose; Janusz Bryzek, Fremont, both of Calif.

[73] Assignee: Maxim Integrated Products, Sunnyvale, Calif.

[21] Appl. No.: 09/473,549

[22] Filed: Dec. 28, 1999

[51] Int. Cl.$^7$ .......................... H01L 23/495; H01L 23/48; H01L 23/12

[52] U.S. Cl. .......................... 257/669; 257/676; 257/692; 257/704; 257/622

[58] Field of Search .................................... 257/690, 692, 257/669, 676, 704, 622

[56] References Cited

U.S. PATENT DOCUMENTS

| | | | |
|---|---|---|---|
| 5,506,425 | 4/1996 | Whitney et al. | 257/177 |
| 5,898,574 | 4/1999 | Tan et al. | 361/777 |

*Primary Examiner*—Ngân V. Ngô
*Attorney, Agent, or Firm*—Townsend and Townsend and Crew LLP

[57] ABSTRACT

A stress-isolated integrated circuit includes a semiconductor die (24) having first and second surfaces (28, 32) and a semi-circumferential trench (44) formed into the first surface of the die to define a stress-isolated region (48). At least some of the active IC components are located in the stress-isolated region. A cavity (46) is formed into the second surface of the die, the cavity being sized so that the trench opens into the cavity to create a cantilevered stress-isolated region extending from the remainder of the die. The second surface of the die is secured to a lead frame (36), the lead frame having bond wires (42) secured to bond pads (26) on the die. A molding compound (54) encapsulates the die, the cap, the bond wires and a portion of the lead frame to create a molded IC device (20). The invention helps to improve performance characteristics and component variables of analog and mixed-signal integrated circuits by isolating critical portions of the integrated circuits from detrimental packaging and molding stresses.

19 Claims, 3 Drawing Sheets

STRESS ISOLATED INTEGRATED CIRCUIT AND METHOD FOR MAKING

BACKGROUND OF THE INVENTION

Precision linear components, such as op amps, comparators, voltage references and AC/DC converters, include active components, such as transistors and diodes, the performance of which is influenced by stresses created by packaging and molding. FIG. 1 illustrates a conventional silicon die 2 having a number of bond pads 4 on a first surface 6. FIG. 2 illustrates a conventional injection molded package 8 in which silicon die 2 has been secured, typically using an epoxy adhesive, to the paddle portion 10 of a lead frame 12. Lead frame 12 includes leads 14 which are electrically connected to selected bond pads 4 by bond wires 16. This assembly is then encapsulated within a suitable molding compound 17 to create an injection molded IC device 18.

One of the problems with conventional packaging when dealing with linear (analog) and mixed-signal (analog and digital) integrated circuits is that offset shifts, as well as shifts of other component values, are often created largely due to packaging stresses, materials having mismatched coefficients of thermal expansion, plastic deformation of molding components, and hysteresis of die mounting materials which vary with temperature and variations in time. Shifts which occur during packaging or while in operation can reduce performance of the part and limit the applicability of the part.

SUMMARY OF THE INVENTION

The present invention helps to improve the performance of a wide range of analog and mixed-signal products in molded packages. The invention permits the production of low offset voltage, stress-isolated operational amplifiers and other linear components in a manner suitable for low profile molded plastic packages.

A stress-isolated integrated circuit includes a semiconductor die having first and second surfaces and active IC components. A semi-circumferential, typically C- or U-shaped, trench is formed into the first surface of the die and defines a stress-isolated region of the die. At least some of the active IC components are located in the stress-isolated region. The trench may extend completely through the die from the first surface to the second surface and a cavity may be formed into the second surface of the die, the cavity being sized so that the trench opens into the cavity; such a configuration creates a cantilevered stress-isolated region extending from the remainder of the die. The second surface of the die may be secured to a lead frame, the lead frame having bond wires secured to the bond pads. A molding compound may be used to encapsulate the die, the cap, the bond wires and a portion of the lead frame to create a molded IC device.

The invention is directed to the improvement of performance characteristics and component variables of, for example, precision linear components, by isolating critical portions of the integrated circuits from detrimental packaging and molding stresses. This isolation is created through the use of a semi-circumferential trench which surrounds the critical components. Further isolation can be achieved using one or more of the following: having the trench extend completely through the die; using a cavity extending from the second surface of the die to intersect the trench; and using a cap secured to the first surface of the die and surrounding the trench so to prevent molding compound from contacting the stress-isolated region. The invention thus permits creation of a stress isolated region of the die while maintaining a low profile.

Other features and advantages of the invention will appear from the following description in which the preferred embodiments have been described in detail in conjunction with the accompanying drawings.

DESCRIPTION OF THE SPECIFIC EMBODIMENTS

Figure 1:
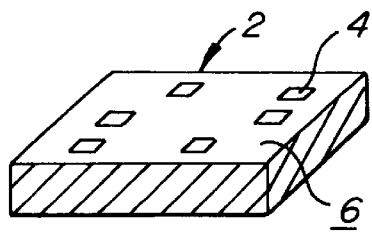
FIG. 1 illustrates a conventional silicon die having bond pads on one surface.
Figure 2:
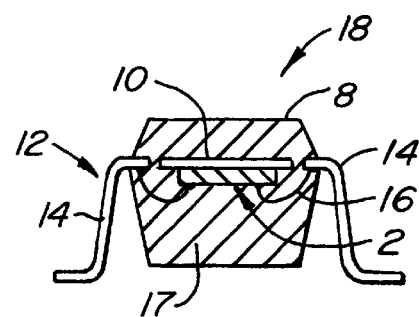
FIG. 2 illustrates a conventional injection molded IC device incorporating the silicon die of FIG. 1.
Figure 3:
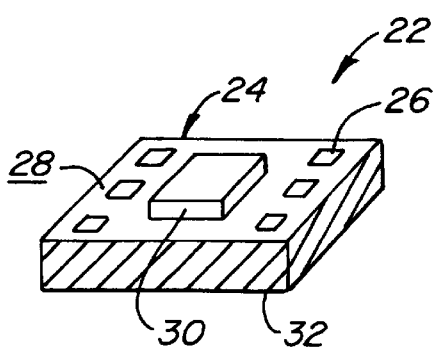
FIG. 3 illustrates an IC device made according to the invention.
Figure 4:
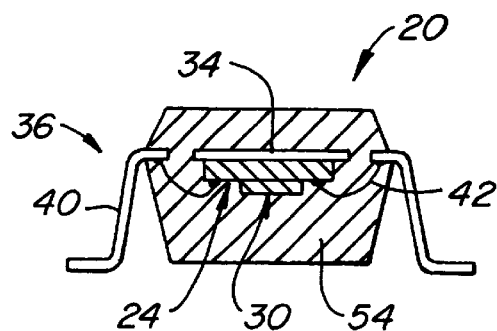
FIG. 4 illustrates a molded IC device incorporating the IC device of FIG. 3.
Figure 5:
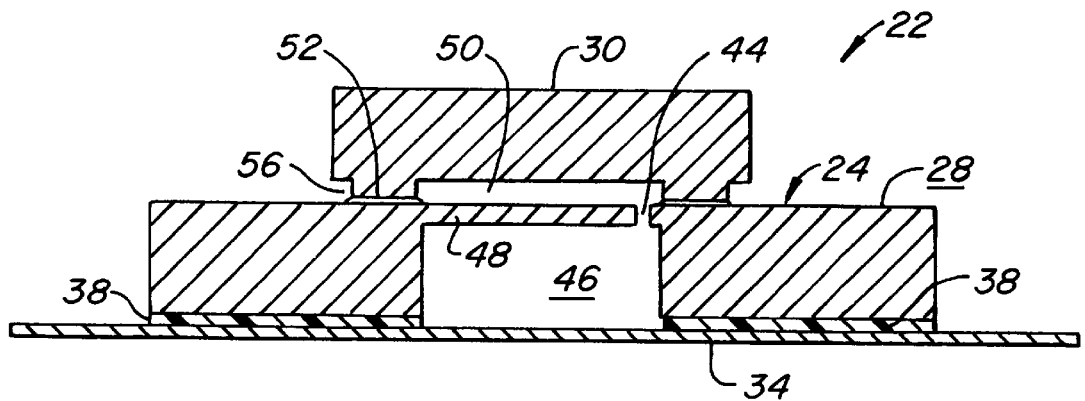
FIG. 5 is an enlarged cross-sectional view of the IC device of FIG. 3 shown mounted to the paddle portion of the lead frame of FIG. 4.

The construction of a conventional injection molded IC device 18 is discussed above with respect to FIGS. 1 and 2. Turning now to FIGS. 3–5, a molded IC device 20 made according to the invention will now be described. Molded IC device 20 includes an IC device 22 comprising a silicon die 24 having a number of bond pads 26 on its first surface 28. A silicon cap 30 is bonded to first surface 28 and covers a portion of first surface 28 while leaving bond pads 26 exposed. The second surface 32 of die 24 is adhered to the paddle portion 34 of a lead frame 36 using an epoxy layer 38 as shown in FIG. 5. Lead frame 36 includes a number of leads 40 which are electrically connected to various bond pads 26 by bond wires 42.

Figure 6:
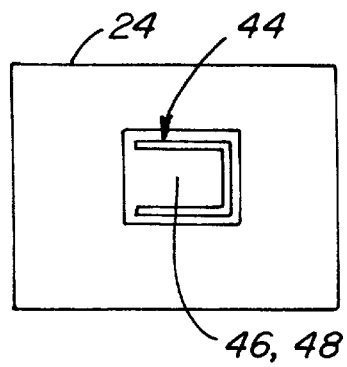
FIG. 6 is a bottom plan view of the IC device of FIG. 3.

Referring now primarily to FIGS. 5 and 6, the construction of IC device 20 will be discussed. Silicon die 24 has a U-shaped, semi-circumferential trench 44 extending from first surface 28 and a cavity 46 extending from second surface 32. Cavity 46 is sized to be somewhat larger than trench 44 so that the trench opens into the cavity. The combination of trench 44 and cavity 46 creates a cantilevered, stress-isolated region 48 containing at least some of the active IC components of silicon die 24.

Region 48 and semi-circumferentially extending trench 44 are covered by silicon cap 30. Silicon cap 30 defines an open region 50 above stress-isolated region 48 and trench 44. Silicon cap 30 is secured to first surface 28 of silicon die 24 by a conventional wafer to wafer bond 52. Paddle portion 34 of lead frame 36 and cap 30 prevent molding compound 54 (see FIG. 4) from contacting stress-isolated region 48; this substantially eliminates component value shifts in the active IC components within stress-isolated region 48 as can occur with conventional injection molded packages 8 shown in FIGS. 1 and 2.

An undercut 56 is formed in cap 30 adjacent first surface 28 to permit molding compound 54 to enter into the undercut to help create a good bond between the molding compound and IC device 22.

Stress-isolated region 48 is preferably designed so that it contains components which are most sensitive to assembly and packaging stresses, such as input stages and biasing circuitry. Metal traces connect the stress-isolated components within region 48 to more robust, typically higher power devices, which can be located exterior to stress-isolated region 48. If desired, all of the active components of IC device 22 could be covered by open region 50.

Figure 7:
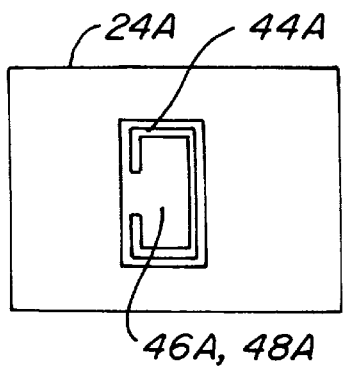
FIGS. 7 and 8 are alternative embodiments of the IC device of FIG. 6 having differently shaped trenches and corresponding cavities.
Figure 8:
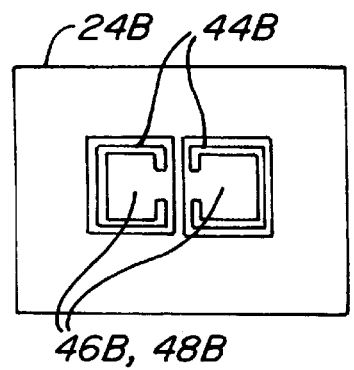

Various shapes for a semi-circumferential trench, in addition to the generally rectangular, U-shaped trench 44 of FIG. 6, may be used. The trench may take 5 other forms, such as the C-shaped trench 44A of FIG. 7. Further, FIG. 8 illustrates a pair of trenches 44B and associated cavities 46B formed in die 24B. Other semi-circumferential shapes for the trench, including curved shapes and shapes including curved and straight segments, may also be used.

Figure 9A:
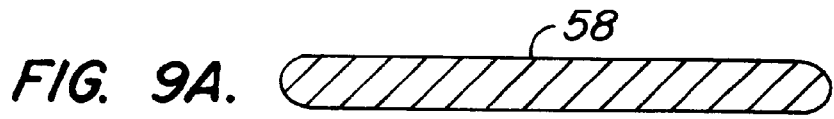
FIGS. 9A–9H illustrate several typical processing steps in manufacturing the IC device of FIG. 3.
Figure 9B:
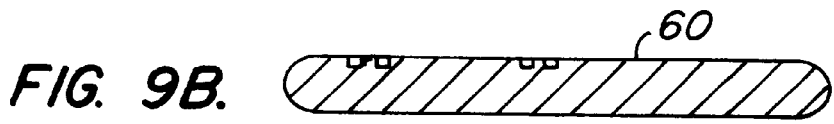
Figure 9C:
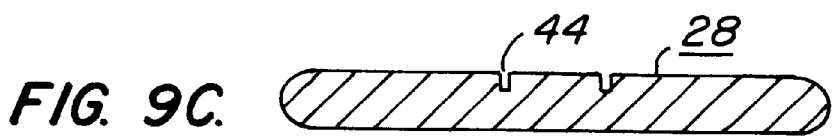
Figure 9D:
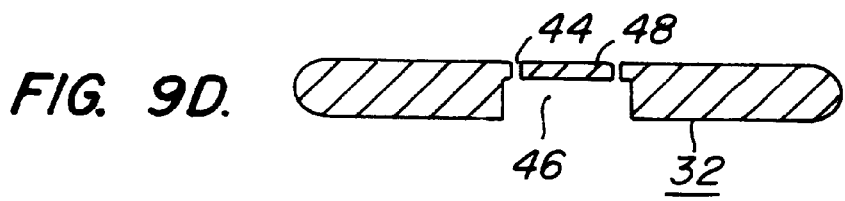
Figure 9E:
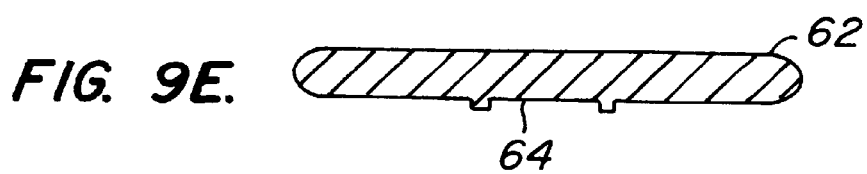
Figure 9F:
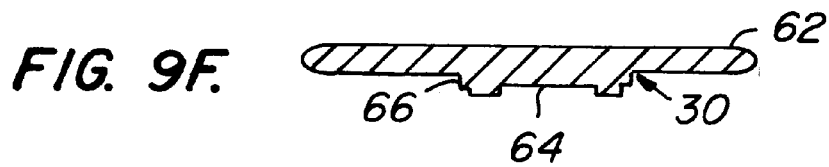
Figure 9G:
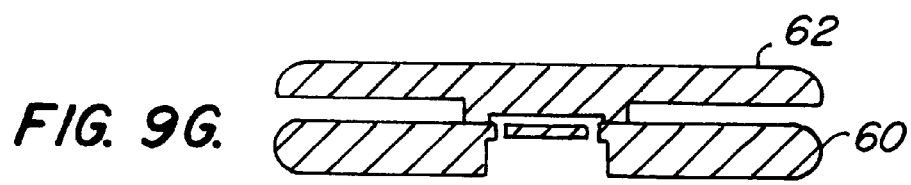
Figure 9H:
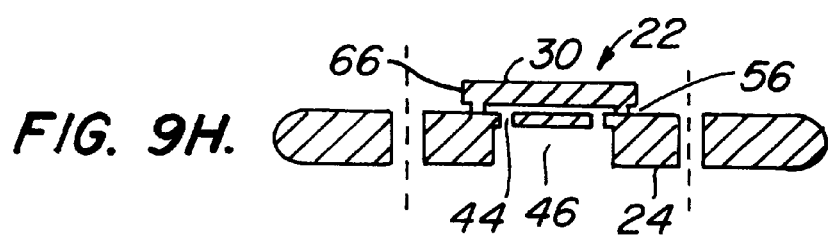

FIGS. 9A–9H schematically illustrate a set of processing steps which may be used in creating IC device 22. The silicon wafer 58 of FIG. 9A is subjected to standard integrated circuit processing sequences known in the art to fabricate primary wafer 60 shown in FIG. 9B. Processing can include, for example, bipolar, CMOS or BiCMOS sequences. The following micro-electro-mechanical (MEMS) processing steps are then performed. Trench 44 is patterned and etched, as shown in FIG. 9C, and cavity 46 is patterned and etched as in FIG. 9D. A cap wafer 62 is patterned and etched to form a cavity region 64 as in FIG. 9E, then patterned and etched again to form the periphery 66 of silicon cap 30 as in FIG. 9F. Although only a single cap is illustrated for clarity, in actuality thousands of caps are patterned and etched using batch fabrication methods typical in the IC industry. Cap wafer 62 and primary wafer 60 are bonded as shown in FIG. 9G and then ground to desired specifications and diced as shown in FIG. 9H to create IC devices 22. The IC devices may be laser trimmed to enhance precision and performance. Accommodations for the bonding of cap 30 are made during the layout of the integrated circuitry so that no metal interconnect traces are severed by the trench 44 or shorted by bonding of cap 30. Eutectic, thermocompression, glass and anodic wafer-to-wafer bonding are suitable techniques for bonding of cap 30 to surface 28 of silicon die 24.

Figure 10A:
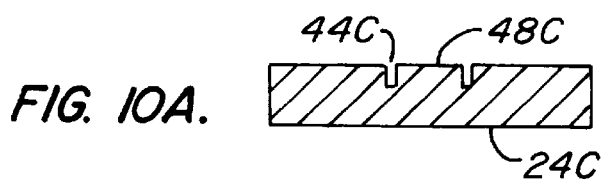
FIGS. 10A–10E illustrate a range of isolation structure with generally increasing levels of stress isolation.
Figure 10B:
Figure 10C:
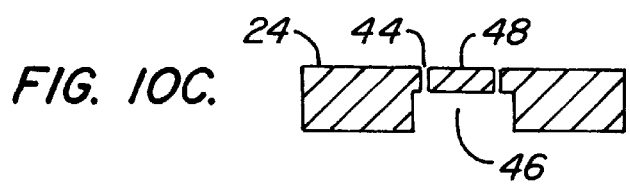
Figure 10D:
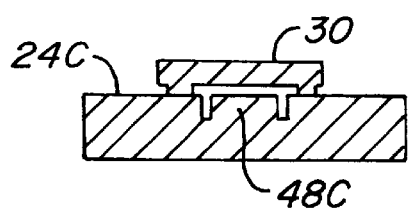
Figure 10E:
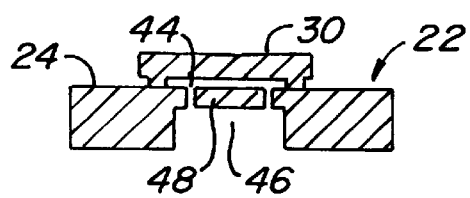

Stress isolation can be achieved to different degrees and levels. FIGS. 10A–10E illustrate five different embodiments with generally increasing levels of stress-isolation. Trench 44C of FIG. 10A is partially etched through the wafer and used to provide stress isolation. Silicon die 24C of FIG. 10A would then be secured to a lead frame and encapsulated within a molding compound without the benefit of cap 30. FIG. 10B illustrates an alternative to the embodiment of FIG. 10A in which trench 44D extends completely through silicon die 24D; a cap 30 may or may not be used with die 24D. FIG. 10C illustrates an embodiment in which trench 44 and cavity 46 are used with silicon die 24 but without cap 30. FIG. 10D illustrates the use of cap 30 with silicon die 24C of FIG. 10A so to prevent a molding compound from contacting region 48C. The preferred embodiment of FIGS. 3–6 and 10E provides the greatest level of stress isolation.

In addition to stress isolation, region 48 also has improved thermal isolation so to help precision matched devices in region 48 maintain a common temperature for enhanced performance.

The present invention may provide several benefits including: reduced shift of precision components values, such as offset, during packaging and assembly; reduced variation of electrical characteristics prior to trimming; retention of accurate trimming; reduced shift in variation of offset voltage with temperature; and compatibility with conventional semiconductor processing techniques. The invention can be compatible with conventional injection molding processing techniques, and has the ability to be incorporated into emerging families of low cost, low profile injection-molded packages. The invention may provide increased thermal isolation for improved matching and common-mode cancellation of temperature effects.

Other modifications and variations can be made to the disclosed embodiments without departing from the subject invention as defined in the following claims.

What is claimed is:

1. A stress-isolated integrated circuit (IC) comprising:
   a semiconductor die having first and second surfaces and active IC components; and
   a semi-circumferential trench formed into the first surface defining a stress-isolated region of the die, at least some of the active IC components located in the stress-isolated region.

2. The integrated circuit according to claim 1 wherein the trench is generally U-shaped.

3. The integrated circuit according to claim 1 wherein the trench is generally C-shaped.

4. The integrated circuit according to claim 1 further comprising a plurality of said trenches.

5. The integrated circuit according to claim 1 wherein the trench extends completely through the die from the first surface to the second surface.

6. The integrated circuit according to claim 1 further comprising a cavity formed into the second surface of the die, the cavity being sized so the trench opens into the cavity, wherein the stress-isolated region is a cantilevered stress-isolated region extending from the remainder of the die.

7. The integrated circuit according to claim 1 further comprising a cap affixed to the first surface and defining an open region between the stress-isolated region and the cap.

8. The integrated circuit according to claim 7 further comprising a cavity formed into the second surface of the die sized so the trench opens into the cavity, wherein the stress-isolated region is a cantilevered stress-isolated region extending from the remainder of the die.

9. The integrated circuit according to claim 8 wherein the first surface of the die comprises bond pads laterally spaced apart from the cap.

10. The integrated circuit according to claim 9 further comprising:
    a leadframe secured to the second surface of the die, the leadframe comprising bond wires secured to the bond pads; and
    a molding compound encapsulating the die, the cap, the bond wires and a portion of the leadframe to create a molded IC device.

11. The integrated circuit according to claim 7 wherein the first surface of the die comprises bond pads laterally spaced apart from the cap.

12. The integrated circuit according to claim 11 further comprising:
    a leadframe secured to the second surface of the die, the leadframe comprising bond wires secured to the bond pads; and
    a molding compound encapsulating the die, the cap, the bond wires and a portion of the leadframe to create a molded IC device.

13. A method for forming an integrated circuit (IC) with a stress-isolated region, comprising:

obtaining a semiconductor die having first and second surfaces and active IC components; and forming a semi-circumferential trench into the first surface of the semiconductor die thereby defining a stress-isolated region of the die containing at least some of the active IC components.

14. The method according to claim 13 wherein the trench forming step creates a trench extending completely through the die from the first surface to the second surface.

15. The method according to claim 13 further comprising:

forming a cavity into the second surface of the die, the cavity sized so the trench opens into the cavity.

16. The method according to claim 15 further comprising:

affixing a cap to the first surface to define an open region between the stress-isolated region and the cap.

17. The method according to claim 16 further comprising:

securing a leadframe to the second surface of the die;

securing bond wires from the leadframe to the bond pads; and encapsulating the die, the cap, the bond wires and a portion of the leadframe with a molding compound to create a molded IC device.

18. The method according to claim 13 further comprising:

securing a leadframe to the second surface of the die;

securing bond wires from the leadframe to the bond pads; and encapsulating the die, the bond wires and a portion of the leadframe with a molding compound to create a molded IC device.

19. The method according to claim 13 further comprising the step of situating selected said active IC components within said stress-isolated region.

* * * * *